(12) United States Patent
Wiktor

(10) Patent No.: US 8,450,989 B2
(45) Date of Patent: May 28, 2013

(54) TRACKING CURRENT THROUGH SWITCHING DEVICES

(75) Inventor: Stefan W. Wiktor, Raleigh, NC (US)

(73) Assignee: Texas Instruments Incorporated, Dallas, TX (US)

( * ) Notice: Subject to any disclaimer, the term of this patent is extended or adjusted under 35 U.S.C. 154(b) by 146 days.

(21) Appl. No.: 12/843,414

(22) Filed: Jul. 26, 2010

(65) Prior Publication Data

US 2012/0019226 A1 Jan. 26, 2012

(51) Int. Cl.
*G05F 1/618* (2006.01)
*G05F 1/575* (2006.01)

(52) U.S. Cl.
USPC .......................... 323/283; 323/284; 323/285

(58) Field of Classification Search
USPC ................ 323/224, 282, 284, 285, 225, 268, 323/271
See application file for complete search history.

(56) References Cited

U.S. PATENT DOCUMENTS

| 6,160,388 | A  | * | 12/2000 | Skelton et al. | 323/282 |
| 7,019,504 | B2 | * | 3/2006  | Pullen et al.  | 323/283 |
| 7,045,993 | B1 | * | 5/2006  | Tomiyoshi      | 323/224 |
| 7,274,183 | B1 | * | 9/2007  | Gu et al.      | 323/288 |
| 7,936,160 | B1 | * | 5/2011  | Sheehan        | 323/285 |

* cited by examiner

*Primary Examiner* — Gary L Laxton
(74) *Attorney, Agent, or Firm* — William B. Kempler; Wade J. Brady, III; Frederick J. Telecky, Jr.

(57) ABSTRACT

A system can include a switching circuit configured to conduct electrical current through at least one switch device thereof during an activation interval of the switch device in response to a periodic control signal. A tracking system is configured to provide a tracking signal indicative of a predetermined point of the activation interval. Sampling circuitry is configured to measure the electrical current at the predetermined point of the activation interval in response to the tracking signal, such that the sampling circuitry provides an output signal indicative of an average electrical current.

19 Claims, 3 Drawing Sheets

TRACKING CURRENT THROUGH SWITCHING DEVICES

TECHNICAL FIELD

This disclosure relates to electrical circuits and, more particularly, to tracking average current through switching devices.

BACKGROUND

Power supplies are utilized to supply electronic power for a variety of devices. The type of power supply can vary depending on the power requirements for a given application. For regulated power supplies, some type of feedback or monitoring is used to control the level of regulated electrical power in the form of current or voltage.

One common type of power supply is a switched-mode power supply that employs one or more switches arranged as a converter to supply a regulated output voltage from a source to a load. The regulated output voltage is usually different level from the voltage of the source. The regulated voltage or current is controlled by varying the ratio of on to off time (e.g., duty cycle) of the switch or switches of the converter, such as through pulse-width modulation.

In many power applications, there is a need to process and report accurate load current information. Most existing solutions are either expensive to implement and/or may not provide sufficient accuracy.

SUMMARY

This invention relates to tracking current through switching devices, such as can be utilized to determine average current.

One embodiment of the invention provides a system that can include a switching circuit configured to conduct electrical current through at least one switch device thereof during an activation interval of the switch device in response to a periodic control signal. A tracking system is configured to provide a tracking signal indicative of a predetermined point of the activation interval. Sampling circuitry is configured to measure an electrical signal at the predetermined point of the activation interval in response to the tracking signal, such that the sampling circuitry provides an output signal indicative of an average electrical current.

Another embodiment provides a power supply system. The power supply system includes an output stage comprising at least one switch device connected between an output and a predetermined voltage. The output stage is configured to supply load current to a load that is connected to the output thereof. A control system is configured to control the at least one switch device to conduct electrical current through the at least one switch device during an activation interval thereof. Tracking circuitry is configured to provide a tracking signal that is dynamically synchronized to a predetermined point of the activation interval. Sampling circuitry is configured to measure an electrical signal, which corresponds to the current through the at least one switch device, as commanded by the tracking signal such that the sampling circuitry provides a sampling signal that represents an average indication of the load current.

DETAILED DESCRIPTION

The invention relates to tracking current through switch devices, such as switches that form part of a switching power supply. A tracking system can be utilized to identify a timing parameter of a switching signal and generate a tracking signal. For instance, the timing parameter can correspond to a midpoint of the switching signal (e.g., a pulse) that is supplied to activate a switch device. The tracking signal can thus be utilized for controlling when to sample and hold a measured electrical signal, such as corresponds to electrical current through a switch device (e.g., a transistor) of the power supply. The electrical signal can be measured at different locations in a current path that includes the switch device being controlled by the switching signal, such as across the switch device itself or another device in the path. In one embodiment, the tracking signal can be utilized to measure the electrical current through the switch device as to correspond to an average load current that is supplied by the power supply.

The systems and methods described herein can be utilized with virtually any switching topology that employs a periodic waveform. The system can be implemented with a high degree of accuracy and at reduced cost relative to many existing approaches. For example, the system can be embodied in an integrated circuit (IC) chip using existing circuitry in the power supply with relatively little other circuitry on the IC, such circuitry as for implementing the tracking and sampling of the electrical signals.

Figure 1:
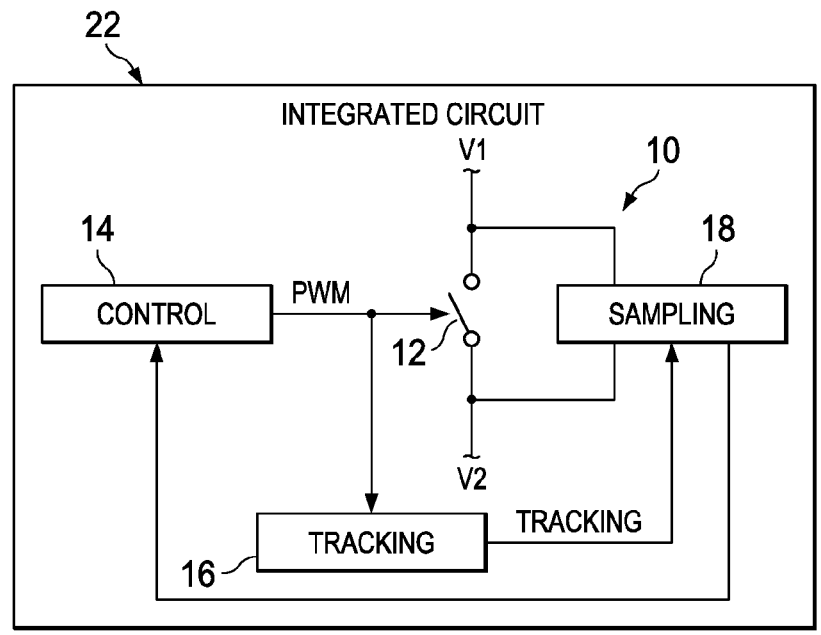
FIG. 1 depicts an example of a system for monitoring current according to an aspect of the invention.

FIG. 1 depicts an example of part of a power system 10 that can be implemented according to an aspect of the invention. The system 10 includes at least one switch, indicated at 12, that is connected between voltage nodes V1 and V2. For example, V1 can be at a greater voltage than V2. Thus, in response to operation of the switch to a closed condition, current can flow from V1 to V2 accordingly. The switch 12 can be implemented as a transistor, such as a field effect transistor (FET) or other type of switch device (e.g., bipolar transistor). The switch 12 is controlled in response to a switching control signal.

In the example of FIG. 1, the switching control signal is a pulse-width modulated (PWM) signal having a duty cycle defined by an on-time and off-time thereof. The PWM signal can be provided by a control system 14. For instance, the control system 14 can provide the PWM signal to the switch 12 as well as to one or more other switches in the power system 10 to control voltage and/or current supplied to a load (not shown). The load can be connected to an output corresponding to one of the voltage nodes V1 or V2, for example. Since the control system can vary the duty cycle of the PWM signal over time, the resulting activation interval for the switch device may also vary over time, such as to supply a desired regulated output current to the load.

By way of example, the current that is delivered to the load, referred to herein as a load current, can have average load current that can vary over time and as a function of operating conditions. The average load current can also depend on the operation of the switch 12, the components used in the power system 10, and/or input voltages for the power system. As one example, where the power system comprises a Buck converter in which the switch 12 is part of an output stage thereof, the average load current can be equal to a DC regulated current plus the average current ripple that occurs due to the switching operation of the switch 12 and any other switch or switches in the power system 10. The current through the switch 12 thus corresponds to the load current during the time interval that the switch is activated to conduct current through the switch. The current is typically provided to an inductor as well as other output circuitry. The current through the switch 12 changes linearly in response to the operation of the switch 12.

For the example of a Buck converter, current measured through a high-side switch (e.g., the switch 12), indicated at $I_{MON}$ (see FIG. 2), can be expressed as follows:

$$I_{MON} = I_{LOAD} - \frac{V_o}{2L} \cdot (1-D)^2 \cdot T_s \qquad \text{Eq. 1}$$

where: $I_{LOAD}$ is the DC load current supplied to the load
$V_O$ is the output voltage;
D is the duration that the switch is activated to conduct current;
L is the inductance of the converter; and
$T_S$ is the switching frequency.

A similar relationship exists for the low-side switch of a Buck converter. It can also be shown that similar relationships can be determined for other switching topologies. From Eq. 1, it is apparent that the accuracy of the measured current $I_{MON}$ through the switch will vary depending on several variables, including the output voltage Vo, switching frequency $T_S$ and L. However, each of these variables can vary from circuit to circuit and can further vary during circuit operation. For instance, the output voltage, while usually substantially constant, is application dependent. The inductance L is load dependent and can vary over temperature. The activation interval D for a given switch 12 further can vary during operation based on control information to maintain a regulated output current or voltage. As used herein, the term "activation interval" denotes a time interval during which a given switch device is activated to conduct current therethrough. The type of control signal to activate a given switch can vary depending on the type of switch device, as is known in the art. For the example of an N-type FET, the activation interval is the on-time of the PWM pulse.

The system 10 is configured to effectively eliminate the variables from Eq. 1, such that $I_{MON}= I_{AVERAG\_LOAD\_CURRENT}$. This can be achieved by sampling and holding the measured current through the switch 12 at a predetermined point of its activation interval. In the example of FIG. 1, the power system 10 includes tracking circuitry 16 that is configured as means for providing a tracking signal indicative of the predetermined point of the activation interval provided by the control signal PWM that activates the switch 12. The tracking system 16 can employ feedback based on the tracking signal or another output signal that is generated in response to the PWM input signal to enable the tracking system 16 to adjust and lock on to the midpoint based upon operation of the power system 10 and the PWM signal. That is, the tracking system 16 dynamically locks on to the PWM signal (e.g., with a rising or falling edged thereof) and based on such synchronization generates the tracking signal at the predetermined point (e.g., the midpoint) of the activation interval.

Sampling circuitry 18 is configured to measure an electrical signal in response to the tracking signal. The sampling circuitry 18 provides a corresponding output signal indicative of the measured signal at the predetermined point of the activation interval, based on which an indication of electrical current through the switch. Since, in one embodiment, the tracking system provides the tracking signal to correspond to the midpoint of the activation interval for the switch 12, the sampling circuitry 18 is thus commanded by the tracking signal to provide its output signal as corresponding to the current through the switch at the midpoint of its activation interval. As a result, the output signal from the sampling circuitry 18 can have a value indicative of an average load current that is provided by the power system 10.

The sampling circuitry 18 can also be used to measure current and/or voltage on other elements (e.g., capacitor, inductor, resistor or the like) not directly responding to control signal (PWM). Such elements can be implemented in the same IC as the power supply or, in other embodiments, can be implemented external to the IC.

Those skilled in the art will understand and appreciate various types of circuits that can be utilized to implement the tracking system 16 and sampling circuitry 18 based on the teachings herein. For example, the sampling circuitry 18 can be implemented as a sample-and-hold circuit that is configured to sample the current through the switch 12 and, in response to the tracking signal, hold the sample in such circuitry (e.g., in one or more capacitor thereof) corresponding to the current at the midpoint of its activation interval. The sample-and-hold circuit holds the value for a duration, such as can facilitate controlling the system 10 with feedback for power monitoring. Those skilled in the art will understand and appreciate various types of sample-and-hold circuitry that can be utilized in the system 10. The sampling circuitry 18 can provide its output as an analog signal or a digital signal corresponding to the sampled current through the switch 12. For example, the average load current indicated by the output from the sampling circuitry can be utilized by the control to implement power throttling or by a power fuel gauge application. Those skilled in the art will understand and appreciate various other uses of the sampling output signal that is captured by the sampling circuitry 18. Additionally, operation and configuration of the tracking system 16 can vary depending upon the type of power system and the number of switches implemented in the system 12.

Figure 2:
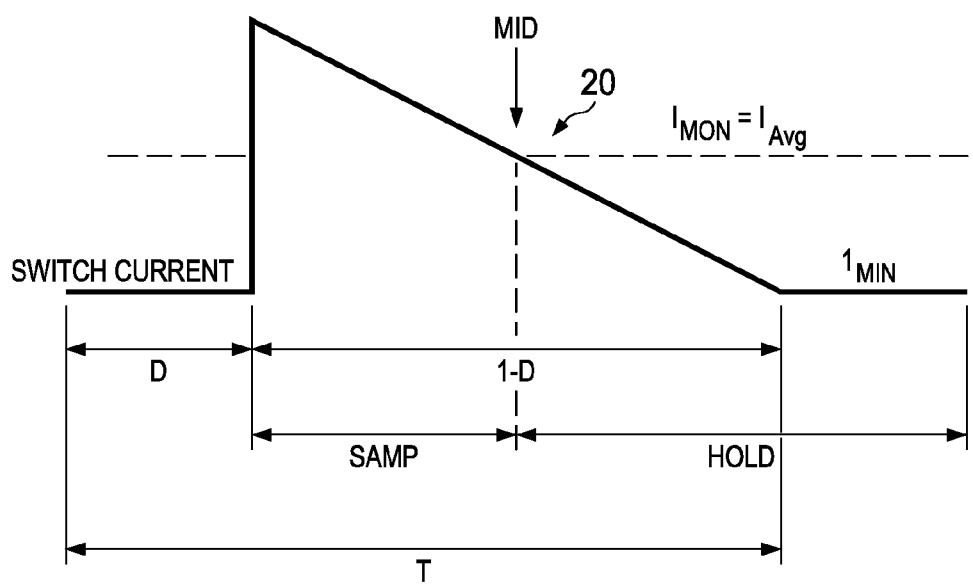
FIG. 2 depicts an example of a waveform demonstrating an approach for sampling a monitored current according to an aspect of the invention.

As a further example, FIG. 2 demonstrates an example of a current signal that can be supplied through the switch 12 operating as a low-side switch device in a switching power supply (e.g., a buck converter). In the example of FIG. 2, the switch 12 is activated to conduct current for the activation interval indicated at 1–D and the period of the switching signal is indicated at T. The interval D corresponds to an off-time for the switch, which can also represent the on-time of an associated high side switch device of the converter.

As illustrated, the switch current 20 is at its minimum current, indicated at $I_{MIN}$, for the timing interval D while the switch is deactivated (e.g., open). The minimum current $I_{MIN}$ can correspond to a regulated current, such as the regulated DC current supplied by operation the switch 12 and its associated high-side switch (not shown). The switch 12 is activated (e.g., closed) for a subsequent time 1–D to conduct current. This peak current level corresponds to the current that is supplied to the load by an associated high side switch. While the switch 12 is activated, the current decreases linearly from the peak current down to the minimum current $I_{MIN}$. The current through the switch 12 during its activation interval 1−D contributes to current ripple to the DC regulated current, which is due to the switching of the associated switch in the power system 10. Each switch in the system 10 can contribute to current ripple according to its operation.

With reference between FIGS. 1 and 2, the sampling circuit 18 is configured to sample the current through the switch device while the switch is activated which period is indicated at SAMP. As mentioned above, the tracking system 16 is configured to determine a midpoint in time for the activation interval of switch 12 in response to the PWM signal. The tracking system 16 locks in to the midpoint of the portion of the PWM signal and generates the corresponding tracking signal MID, such as a pulse for activating the sampling circuitry. In response to the tracking signal MID, the sampling circuitry 18 locks in and holds the value indicative of the electrical current through the switch 12 when triggered by the MID signal. This monitored current, which is held in the sampling circuitry 18 for a duration indicated in FIG. 2 as HOLD (e.g., from the midpoint of the PWM signal to beginning of the next pulse). Thus, the current through the switch at the midpoint of its activation interval is provided as the output signal. The output signal can be supplied to an associated control circuitry for performing various control and/or diagnostic functions, such as described herein.

In the example of FIG. 1 the system 10 can be implemented on an integrated circuit (IC) chip 22 without additional external circuitry. Thus, the IC 22 in the example of FIG. 1 can be implemented as less expensive solution relative to many existing solutions since it does not require external processing or external circuitry.

Figure 3:
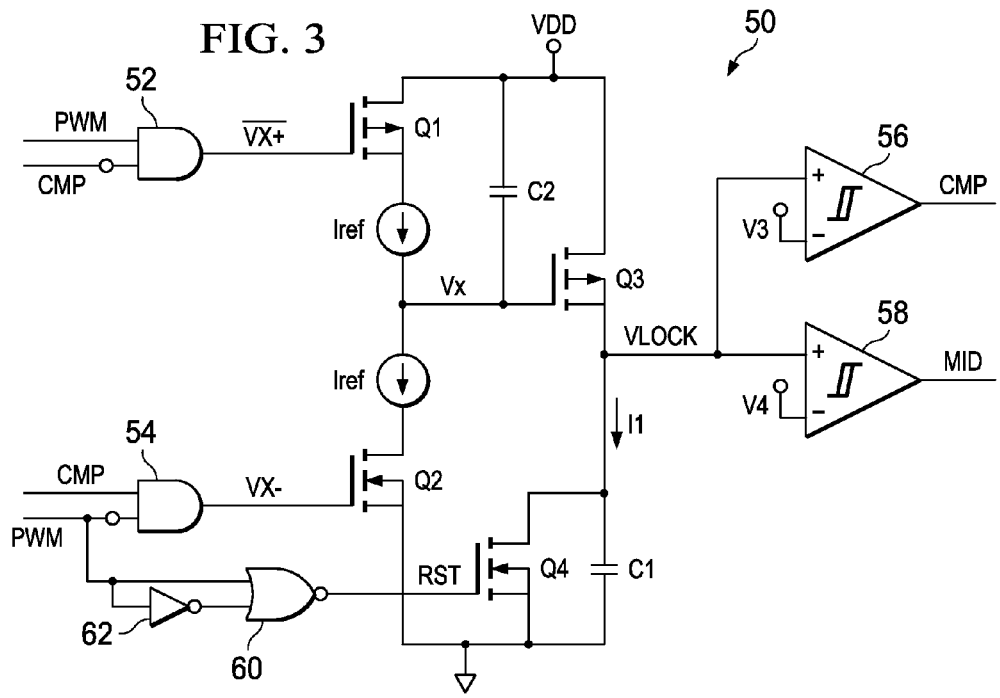
FIG. 3 depicts an example of a tracking system that can be implemented control sampling of current according to an aspect of the invention.

As a further example, FIG. 3 depicts an embodiment of a tracking system that can be implemented for commanding sampling circuitry (e.g., the sampling circuitry 18 of FIG. 1). A tracking system 50 can be implemented for each switch device for which current is being monitored. The tracking system 50 receives a periodic control signal PWM that is utilized to activate the switch device for which the current is being monitored. Thus, in the example of FIG. 3, the tracking system 50 receives the PWM signal at corresponding input logic.

In this example, the input logic includes AND gates 52 and 54 as well as a NOR gate 60 and an inverter 62. The AND gate 52 combines the PWM input signal with an inverted version of a comparator output signal (CMP) to generate a corresponding logic signal $\overline{VX+}$. The AND gate 54 logically ANDs the CMP feedback signal with an inverted version of the PWM input signal to produce a corresponding VX− Signal. The $\overline{VX+}$ signal is provided to the gate of a transistor Q1 and the VX− signal is provided to the gate of another transistor Q2. Q1 is in series with a current source that provides a reference current IREF and another current source is connected in series with the transistor Q2 for also providing the same current IREF.

An intermediate node between the current sources is coupled to an input of another transistor Q3 for providing a voltage, depicted at VX. A capacitor C2 is connected between VX and a voltage source VDD. Thus, Q3 is activated based upon the voltage across the capacitor C2 (corresponding to VDD-VX) to produce am electrical current through Q3, indicated at I1. The current I1 charges the capacitor C1 to produce a corresponding output voltage indicated at VLOCK. The voltage across capacitor C1 VLOCK thus tracks the current I1. VLOCK is provided as an input to comparators 56 and 58.

The comparator 56 also receives as an input a predetermined voltage signal V3 based on which the comparator 56 produces the comparator output signal CMP. As mentioned above, the comparator output signal CMP is provided as feedback to the AND gates 52 and 54. Thus, it is based on the feedback of the comparator output signal CMP that the tracking system 50 adjusts the output voltage VLOCK to the predetermined voltage V3. The voltage V3 can be selected somewhere between VDD and ground.

The other comparator 58 compares the VLOCK signal relative to another voltage V4, which can be a fractional part of V3 (e.g., ½V3 or the like) to produce the output signal MID. Since the system 50 operates to lock VLOCK to the V3 voltage, the MID signal is provided at a midpoint of the activation portion of PWM pulse.

The system 50 can be reset with each PWM pulse via the logic gates 60 and 62. In the example of FIG. 3, the PWM input is provided as inputs to the NOR gate 60 and to the inverter 62 to produce a reset signal (RST), as depicted in FIG. 3. The RST signal thus is used to reset the VLOCK voltage each period of the PWM signal. In response to the RST signal is asserted at the falling edge of each PWM signal, the capacitor C1 is discharged through transistor Q4. Since the comparator output signal CMP is fed back to the input logic 52 and 54, over a small number of PWM pulses, VLOCK is dynamically adjusted to V3. As a result, the other comparator 58 provides the MID output signal synchronized at the midpoint of the activation interval provided by the PWM signal. Those skilled in the art will understand and appreciate various types of logic and other circuitry that can be utilized to produce a corresponding reset signal for resetting the circuitry to facilitate locking the VLOCK voltage to V3.

Figure 4:
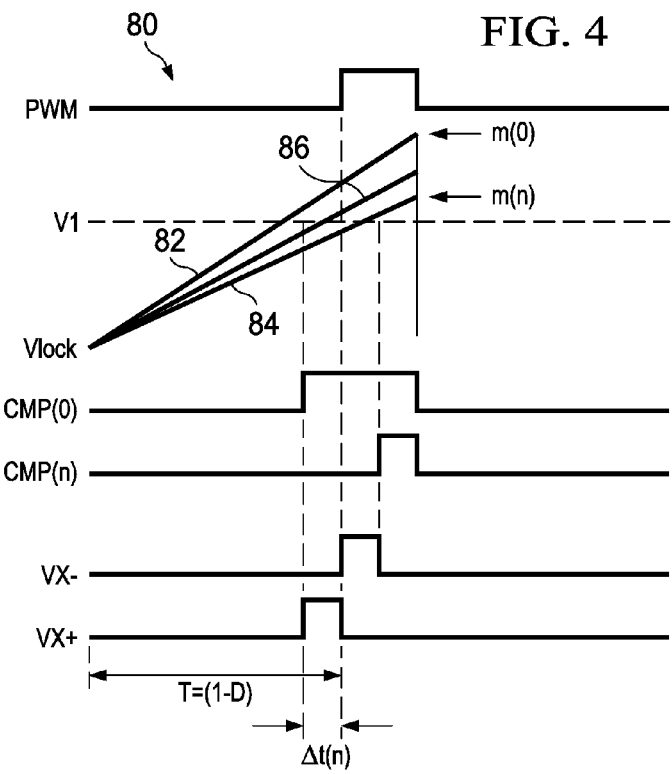
FIG. 4 depicts an example of a timing diagram illustrating waveforms from the system of FIG. 3.

FIG. 4 is a timing diagram depicting signals from the tracking system 50 of FIG. 3. In the example of FIG. 4, VLOCK is depicted for a plurality of different slopes, indicated at m(0) and m(n) relative to a PWM signal, where n denotes the number of consecutive switching periods for the VLOCK signal to lock onto the predetermined voltage V3. The different slopes of VLOCK represent different iterations of the PWM signal but have been superimposed in time for purposes of illustration to demonstrate the function of the tracking system 50. The slope of the VLOCK signal varies for different iterations of the PWM pulse based on the output signal CMP from the comparator 56. From FIGS. 3 and 4, it is shown that the CMP signal together with the PWM signal form a timing base for the feedback loop of the tracking system 50. This timing base is represented by $\overline{VX+}$ and VX− signals, which are derived based on logic applied to the PWM signal and the CMP signal, such as shown in FIG. 3. A timing difference $\Delta t(n)$ between the PWM signal going high and the CMP signal defines $\overline{VX+}$.

For example, on a first iteration the comparator 56 generates CMP (0) based on the comparison of the VLOCK signal 82 having a slope indicated at m(0). The CMP(0) signal thus is fed back to the input logic for producing corresponding $\overline{VX+}$ and VX− signals, such as depicted in FIG. 4. The $\overline{VX+}$ and VX− signals are used to control the current I1 and the slope of VLOCK. Over a next iteration, for example, after the tracking system has been reset, the VLOCK signal will adjust based upon the comparator output signal CMP(0). The VLOCK signal will further adjust to the signal 84 having a slope of m(n). As the slope of the VLOCK signal decreases to m(n), the comparator signal CMP(n) triggers during the PWM pulse at a time that is later than the first VLOCK signal 82. Eventually the slope of the VLOCK signal will be provided with the desired slope, indicated at 86, as to lock onto the rising edge of the PWM pulse. The exact timing and the number of PWM pulses to achieve a sufficient lock can vary depending on the type of components and implementation of the tracking system. The VLOCK signal, being locked on the rising edge of the PWM pulse, provides an efficient way to generate the midpoint signal MID that will dynamically adjust to changes in the PWM signal over time. For instance, by setting the reference voltage for the comparator 58 to V4, which is supplied to the comparator 58, a corresponding time stamp signal can be generated at the predetermined point of the activation interval of the PWM pulse.

Those skilled in the art will appreciate the effects of comparator delays can be cancelled by using similarly configured comparators 56 and 58. Thus, the tracking system 50 provides an efficient circuit that can be implemented in an IC with a corresponding power system (e.g., a power converter). Additionally, while the example of FIGS. 3 and 4 have been described with respect to tracking the rising edge of the incoming signal, it would be appreciated that a tracking system can be configured to track the falling edge. Still further, the system 50 can be designed to track other timing instances than a midpoint of a period, such as by setting the reference voltages V3 and V4 as having a corresponding ratio that is different than ½. For instance, the ratio of voltages can be programmable, such as by controlling corresponding voltage divider that is supplied with V3. By setting the ratio of V3 and V4, the tracking system 50 thus can be configured to set any desired timing relationship between PWM periods and the predetermined point.

Figure 5:
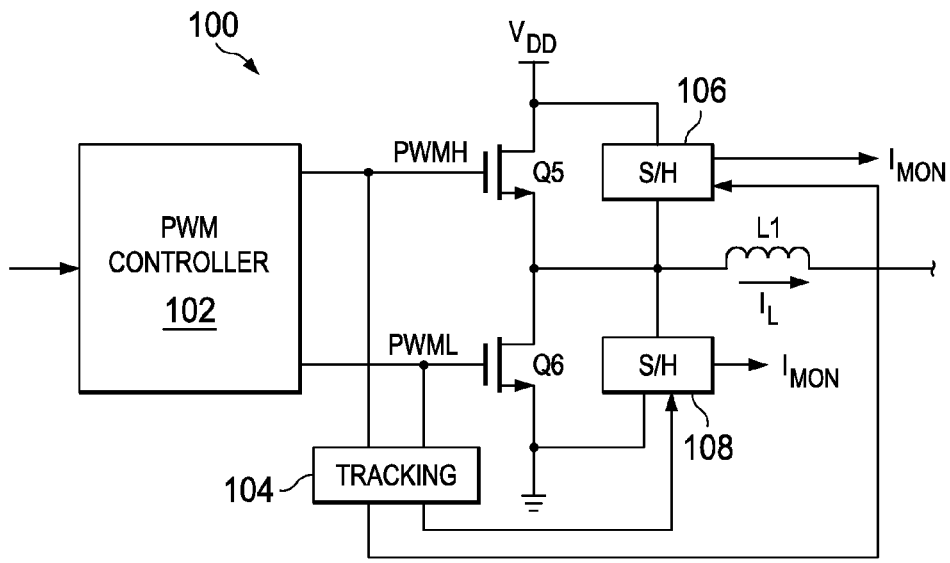
FIG. 5 depicts an example of part of a power system that can be implemented according to an aspect of the invention.

FIG. 5 depicts an example of another power system 100 that can be implemented. The system 100 is depicted in the context of a half-bridge topology having an output stage that includes a high side transistor Q5 and a low side transistor Q6 connected in series between voltage VDD and ground. A PWM controller 102 provides corresponding PWM signals PWML and PWMH to control each of their respective transistors Q5 and Q6. Operation of each of the transistors Q5 and Q6 results in current flow through the transistors commensurate with the output current IL through an inductor L1 and to other output circuitry (not shown). In the example of FIG. 5, when Q5 is activated via PWMH signal current through the transistor Q5 increases from a minimum current level up to a peak current. When the PWMH signal deactivates Q5, the PWML signal activates Q6, such as is known in the art. The current through the transistor Q6 decreases linearly from the peak current (resulting from the activation of transistor Q5) down to the minimum current $I_{MIN}$.

The system 100 includes a tracking system 104 that is utilized to command sampling circuitry to sample and hold the value of a monitored current through one or both of the transistors Q5 and Q6. The tracking system 104 can be configured to provide a tracking signal indicative of a predetermined point (e.g., the midpoint) of one or both of the respective PWMH and PWML signals. The tracking system 104 can be configured based on the teachings contained herein (e.g., FIG. 3). While in the example of FIG. 5 the tracking system 104 tracks the control signals PWMH and PWML for both Q5 and Q6, it will be understood and appreciated that the tracking can be implemented with respect to only one of the transistors Q5 or Q6 or both transistors. The tracking system 104 thus can dynamically lock onto the respective control signals PWMH and PWML and provide tracking signals at predetermined points in the activation intervals for Q5 and Q6.

In the example of FIG. 5, sampling circuitry is depicted as including sample-and-hold (S/H) circuits 106 and 108. Each S/H circuit 106 and 108 provides a corresponding output signal ($I_{MON}$) indicative of the current monitored by the respective circuit in response to the tracking signal. As described herein, a respective tracking signal can command each S/H circuit 106 and 108 to sample-and-hold the current through the respective transistor at the midpoint of its activation interval. As a result, each of the output signals $I_{MON}$ can represent the average load current $I_L$ that is provided through the inductor L1. The $I_{MON}$ signals can be averaged or otherwise selective utilized to ascertain the average load current. While in the example of FIG. 5 the S/H circuits 106 and 108 are shown for tracking electrical current through each of the high side and low side transistors Q5 and Q6, it will be understood and appreciated that the sampling can be implemented with respect to only one of the transistors Q5 or Q6 as to produce an indication of the average load current. That is, the sampled current through one such transistor or through both transistors can be provided to the PWM controller (or other circuitry) to provide an indication of the average load current according to application requirements. The output signal or signals $I_{MON}$ can be provided to the PWM controller 102 or other circuitry according to application requirements.

Figure 6:
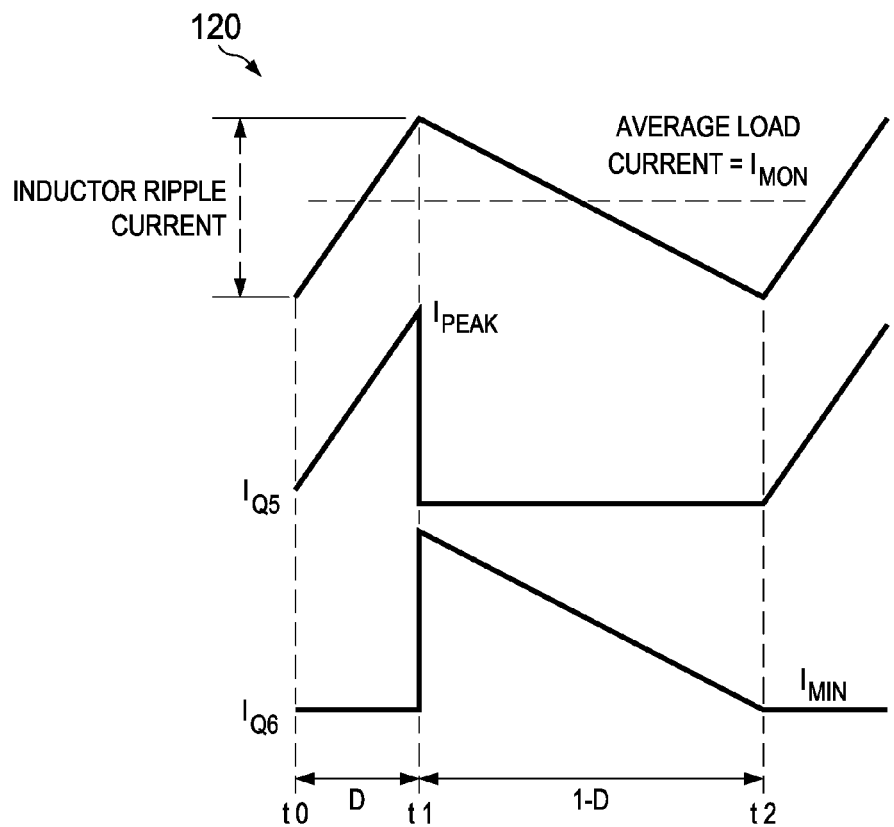
FIG. 6 depicts an example of a timing diagram illustrating waveforms from the system of FIG. 5, which can be used for determining an average load current, according to an aspect of the invention.

FIG. 6 depicts an example of a timing diagram 120 demonstrating the current through each of the high side and low side FETS Q5 and Q6 of FIG. 5, indicated at $I_{Q5}$ and $I_{Q6}$. The timing diagram 120 thus demonstrates current $I_{Q5}$ through the high side FET beginning at time t0 and during an activation interval from time t0 to time t1, indicated at D. Thus, during the activation interval D, the high side current $I_{Q5}$ increases from $I_{MIN}$ up to a peak current $I_{PEAK}$. At time t1, the high side FET is deactivated and remains turned off until time t2 for a duration indicated at 1−D. The time interval between t1 and t2 (1−D), corresponds to the activation interval when the low side FET is activated such that the current $I_{Q6}$ decreases through the low side FET Q6 from $I_{PEAK}$ down to $I_{MIN}$. This process repeats each period of the PWM cycle, and results in the load current $I_L$ through the inductor as shown above. The changes in the load current IL relative to the minimum load current corresponds to inductor ripple current due to the switching of Q5 and Q6 based on PWMH and PWML.

Referring between FIGS. 5 and 6, it will be appreciated that an average indication of the load current $I_L$ through the inductor L1 can be measured by sampling and holding the current through either or both of the transistors Q5 or Q6 at the midpoint of its respective activation interval. Thus, for the high side FET Q5 the average load current occurs at a time of D/2 and similarly occurs at a time of 1−D/2 for the low side FET Q6.

While the following example of FIG. 5 has been described with respect to a Buck type converter, those skilled in the art will understand and appreciate that the concepts are equally applicable to virtually any type of switching topology that is controlled by a periodic signal, such as PWM signal. Additionally, the system 100 can be implemented in an integrated circuit, such as described herein. As a result, an integrated chip can implement circuitry to accurately determine and track the average load current with little or no losses and without external circuitry or use of processors, as would usually be required with other approaches.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A power system comprising:
a switching circuit configured to conduct electrical current through at least one switch device thereof during an activation interval of the at least one switch device in response to a periodic control signal;
a tracking system configured to provide a tracking signal indicative of a predetermined point of the activation interval; and
sampling circuitry configured to measure an electrical signal at the predetermined point of the activation interval in response to the tracking signal, the electrical signal being at least one of a voltage and current corresponding to the electrical current through the at least one switch, such that the sampling circuitry provides an output signal indicative of an average electrical current, wherein a tracking circuit comprises a first comparator having a first input coupled to the measured the electrical signal for comparing a value of the measured electrical signal to a reference voltage, output of the first comparator controlling timing of the periodic control signal so that a peak voltage of the sample will be substantially the reference voltage.

2. The system of claim 1, wherein the switching circuit further comprises a half-bridge circuit that comprises a pair of transistor devices connected in series between a first voltage and a second voltage, an intermediate node between the pair of transistor devices corresponding to an output that provides a load current based on operation of the pair of transistor devices,
wherein the average electrical current indicated by the output signal represents an average of the load current.

3. The system of claim 2, wherein the sampling circuitry is connected to one of the pair of transistor devices, such that the output signal is indicative of the electrical current through the one of the pair of transistor devices to which it is connected at the predetermined point of its respective activation interval.

4. The system of claim 3, wherein the sampling circuitry is connected to the one of the pair of transistor devices having a longer periodic on-time for conducting the electrical current therethrough.

5. The system of claim 2 wherein the predetermined point of the activation interval corresponds to a midpoint of the activation interval.

6. The system of claim 2, further comprising a control circuit configured to provide the periodic control signal, the periodic control signal comprising a first control signal provided to a first transistor of the pair of transistor devices and a second control signal provided to a second transistor of the pair of transistor devices, each of the first control signal and the second control signal having an on-time and an off-time during a given period that provides for mutually exclusive activation intervals for each of the first transistor and the second transistor in the given period.

7. The system of claim 6, wherein the sampling circuitry comprises a sample-and-hold circuit that is connected to the first transistor, the sample-and-hold circuit provides the output signal in response to the tracking signal to represent the electrical current through the first transistor at a midpoint of its activation interval.

8. The system of claim 6, wherein the sampling circuitry comprises a sample-and-hold circuit that is connected to the second transistor, the sample-and-hold circuit provides the output signal in response to the tracking signal to represent the electrical current through the second transistor at a midpoint of its activation interval.

9. The system of claim 1, wherein the sampling circuitry comprises a sample-and-hold circuit configured to sample the electrical signal corresponding to the electrical current through the at least one switch device and to hold the output signal to represent the electrical current through the at least one switch device at the predetermined point of its activation interval thereof.

10. The system of claim 1, further comprising:
a control circuit configured to provide the periodic control signal as a pulse-width-modulated (PWM) signal over a plurality of periods,
the tracking system is configured to provide the tracking signal locked on to the predetermined point of the activation interval for each of the plurality periods.

11. The system of claim 1 implemented on an integrated circuit.

12. The system of claim 1, wherein the sampling circuitry comprises a second comparator coupled to the first input of the first comparator for generating the output signal.

13. A power supply system, comprising:
an output stage comprising at least one switch device connected between an output and a predetermined voltage, the output stage being configured to supply load current to a load that is connected to the output thereof;
a control system configured to control the at least one switch device to conduct electrical current through the at least one switch device during an activation interval thereof;
tracking circuitry configured to provide a tracking signal that is dynamically synchronized to a predetermined point of the activation interval; and
sampling circuitry configured to measure an electrical signal, which corresponds to current through the at least one switch device, as commanded by a tracking signal such that the sampling circuitry provides a sampling signal that represents an average indication of the load current, wherein the tracking circuit comprises a first comparator having a first input coupled to the measured the electrical signal for comparing a value of the measured electrical signal to a reference voltage, output of the first comparator controlling timing of the periodic control signal so that a peak voltage of the sample will be substantially the reference voltage.

14. The system of claim 13, wherein the output stage further comprises a half-bridge circuit that comprises a first transistor device and a second transistor device connected in series between a first voltage and a second voltage, an intermediate node between the first transistor device and the second transistor device corresponding to the output of the output stage,
wherein the sampling circuitry is connected to measure the electrical signal associated with the first transistor device, such that the output signal corresponds to the electrical current through the first transistor device at the predetermined point of its respective activation interval.

15. The system of claim 14, wherein the sampling circuitry comprises a sample-and-hold circuit that is connected to the first transistor device, the sample-and-hold circuit provides the output signal in response to the tracking signal to represent the electrical current through the first transistor device at the predetermined point of its activation interval.

16. The system of claim 15, wherein the predetermined point of the activation interval corresponds to a midpoint of the activation interval.

17. The system of claim 13, wherein the control system provides a pulse-width-modulated (PWM) signal over a plurality of periods for controlling the output stage, the tracking system being configured to provide the tracking signal locked on to the predetermined point of the activation interval for each of the plurality periods.

18. The system of claim 13 implemented on an integrated circuit.

19. The system of claim 13, wherein the sampling circuitry comprises a second comparator coupled to the first input of the first comparator for generating the output signal.

* * * * *